US 6,545,737 B2

(12) United States Patent
Hasegawa et al.

(10) Patent No.: US 6,545,737 B2
(45) Date of Patent: Apr. 8, 2003

(54) FLAT PANEL DISPLAY DEVICE AND MANUFACTURING METHOD THEREOF

(75) Inventors: Tatsuya Hasegawa, Tokyo (JP); Masaichi Ohkubo, Tokyo (JP); Yoshihiro Ito, Tokyo (JP); Sanae Tokunaga, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/978,057

(22) Filed: Oct. 17, 2001

(65) Prior Publication Data

US 2002/0015129 A1 Feb. 7, 2002

Related U.S. Application Data

(62) Division of application No. 09/195,539, filed on Nov. 19, 1998, now Pat. No. 6,331,883.

(30) Foreign Application Priority Data

Nov. 19, 1997 (JP) .............................. 9-318387
Mar. 6, 1998 (JP) .............................. 10-55047

(51) Int. Cl.⁷ .......................................... G02F 1/1345
(52) U.S. Cl. ...................................... 349/152; 349/150
(58) Field of Search ................................. 349/149, 150, 349/151, 152

(56) References Cited

U.S. PATENT DOCUMENTS

| 5,173,369 | A | | 12/1992 | Kataoka ..................... 349/150 |
| 5,358,412 | A | | 10/1994 | Maurinus et al. ............. 439/66 |
| 5,404,239 | A | | 4/1995 | Hirai .......................... 349/150 |
| 5,572,348 | A | | 11/1996 | Sakamoto et al. ........... 349/150 |
| 5,724,056 | A | | 3/1998 | Kato .......................... 349/150 |
| 5,737,272 | A | * | 4/1998 | Uchiyama et al. .......... 345/206 |
| 5,949,502 | A | * | 9/1999 | Matsunaga et al. .......... 349/40 |
| 6,104,619 | A | * | 8/2000 | Shigehiro ................... 257/668 |

FOREIGN PATENT DOCUMENTS

JP          9-5034          1/1997

* cited by examiner

Primary Examiner—Toan Ton
(74) Attorney, Agent, or Firm—Pillsbury Winthrop LLP (57) ABSTRACT

An object of this invention is to provide a manufacturing method of a flat panel display device, in which, to match the position of a lead 30 of a TCP 12 with that of a land 32 of a PCB 14, light is irradiated from a lighting device 22 located substantially just above an axis line of a lead 30 and a shadow is photographed by a camera 20 so as to match the position thereof As a result, this makes it possible to match the positions of the TCP having leads having a fine pitch with those of the lands of the PCB.

2 Claims, 13 Drawing Sheets

FLAT PANEL DISPLAY DEVICE AND MANUFACTURING METHOD THEREOF

This is a Divisional of National Application Ser. No. 09/195,539 filed Nov. 19, 1998 now U.S. Pat. No. 6,331,883.

BACKGROUND OF THE INVENTION

1. Field of the Invention

This invention relates to a flat panel display device such as a liquid crystal display device and a manufacturing method thereof.

2. Description of the Prior Art

Figure 10:
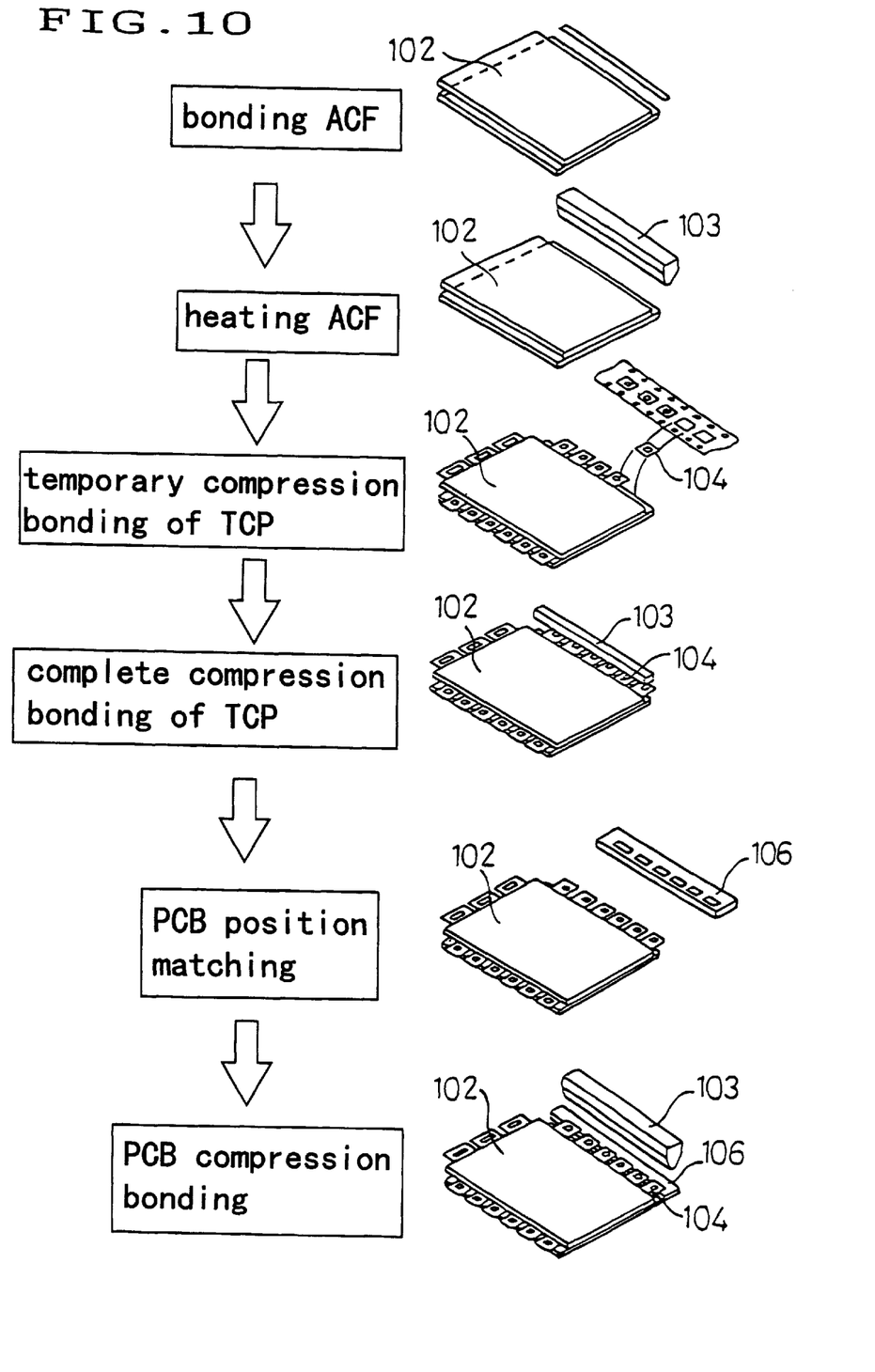
FIG. 10 is an explanatory view of a manufacturing process of liquid crystal display module.

A conventional liquid crystal display module production method will be described with reference to drawings of production process shown in FIG. 10.

After a liquid crystal cell 102 is produced, anisotropic conductive film (hereinafter referred to as ACF) is bonded along an edge portion of the liquid crystal cell 102.

This bonded ACF is heated by a heating means 103 and a tape carrier package (hereinafter referred to as TCP) is temporarily press-fit.

After that, this TCP 104 is heated again from up so as to press-fit the TCP 104 to the liquid crystal cell 102.

Next, the ACF 112 is bonded to a printed circuit board (hereinafter referred to as PCB) 106.

Finally, the positions of the plurality of the TCPs 104 attached to the liquid crystal cell 102 are matched with that of the PCB 106 to be mounted thereon and then the PCB 106 and the TCPs 104 are bonded together with the ACF 112 and fixed.

The above mentioned bonding process for bonding the ACF 112 to the PCB 106 has a following first problem.

Figure 11:
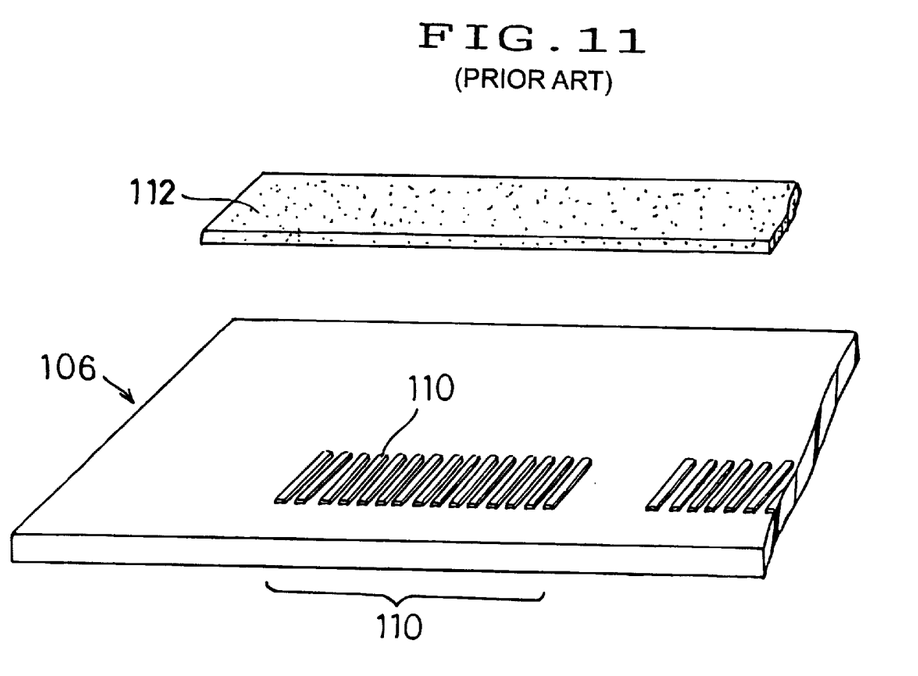
FIG. 11 is a schematic perspective view showing the bonding of the ACF to the top of a conventional PCB.

On a back side of the PCB 106 is already formed a wiring structure 115 such as a copper (Cu) wiring pattern and IVH (interstitial via hole) or a printed pattern by silk screen for indicating PCB serial number. Therefore, a quite number of unevenness are formed on the back side of the PCB 106.

However, the bonding of the ACF 112 is carried out by hands of a worker by visually checking a position of the land group so that the ACF 112 covers a region confirmed by him.

Therefore, the conventional art has the following problems.

(1) First, it is very difficult to secure a bonding position accuracy for the ACF 112, and if it is intended to improve the position accuracy, even a skilled worker needs a sufficient working time. To reduce a working load, it can be considered to ensure a large dimensional margin. However, this does not only lead to increase of production cost, but also conflicts with a demand for narrowing of the frame edge.

Figure 12:
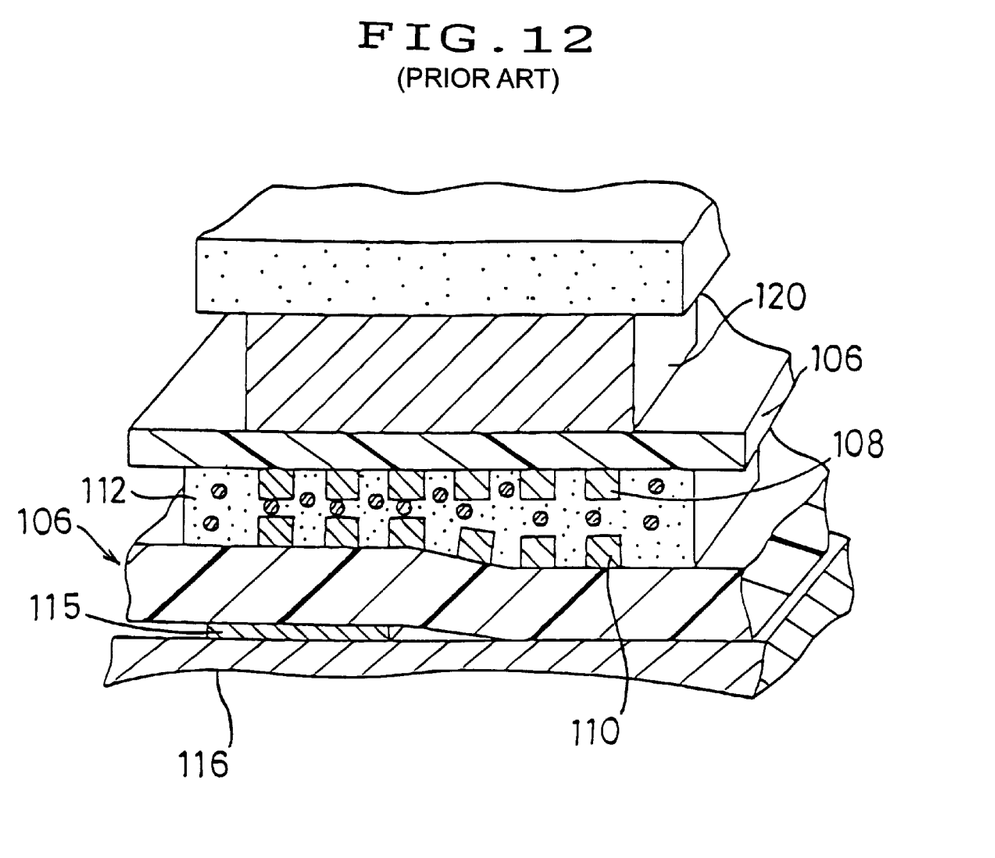
FIG. 12 is a schematic longitudinal sectional perspective view for explaining thermo compression bonding process for the conventional PCB.

(2) As shown in FIG. 12, upon thermo compression bonding, a back side of a terminal connecting portion to which a heat tool 120 is to be applied is covered partly with a printed pattern having a quite thickness such as a wiring pattern 115. Thus, sometimes, a pressing force by the heat tool 120 is not applied equally or sometimes heating is not carried out equally, so that there is a fear that a connection failure may occur in part of the terminals. If the connecting reliability is intended to be secured sufficiently, a time and pressure for thermo compression bonding need to be set to be larger than values originally necessary. Thus, a necessary process load will be increased.

In the process for matching the positions of the TCP 104 and PCB 106, the following second problem exists.

Figure 13:
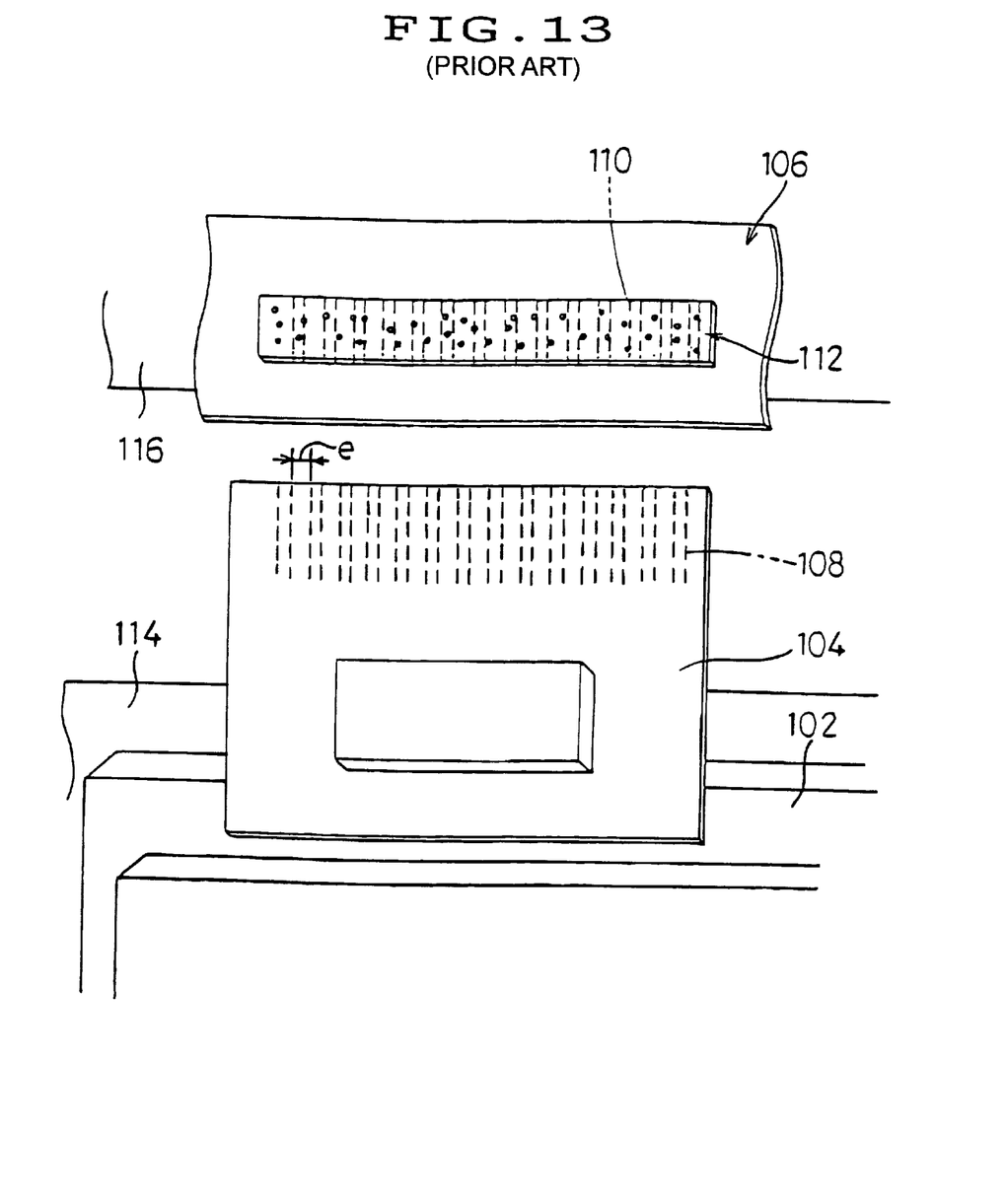
FIG. 13 is a plan view showing a conventional connection method for connecting the TCP and PCB.

FIG. 13 is a further detailed explanatory view as viewing a case in which the position matching between the TCP 104 and PCB 106 is carried out, through a plan. That is, this figure shows a condition that the position of the TCP 104 fixed to the edge of the liquid crystal 102 is matched with that of the lands 110 of the PCB 106.

If the position of the TCP 104 is matched with that of the PCB 106 in the above production process, as shown in FIG. 13, the liquid crystal cell 102 is fixed to a first jig 114 and on the other hand, the PCB 106 is installed on a second jig 116, and the positions of the jigs 114, 116 are matched. Then, the positions of the TCP 104 and PCB 106 are matched with each other.

However, if the above described method for matching the positions of the TCP 104 and PCB 106 is applied, the limit of the gap e between leads 108 of the TCP 104 is 0.5 mm and the position matching with a finer pitch cannot be carried out.

SUMMARY OF THE INVENTION

Accordingly, the present invention has been achieved in views of the above problems and therefore, a first object of the invention is to provide a flat panel display device capable of improving a position accuracy when an ACF is provided so as to obtain electrical and mechanical connections. Further, a second object of the invention is to provide a manufacturing method of a flat panel display device enabling to match the position of a flexible wiring board having leads having a finer pitch with that of a land of a printed circuit board.

To achieve the above object, according to a first aspect of the present invention, there is provided a flat panel display device comprising: a display panel in which a plurality of display picture elements are disposed; a first wiring board one end of which is connected electrically to the display panel and provided with a first terminal group at the other end thereof; and a second wiring board provided with a second terminal group corresponding to the first terminal group at a main surface thereof, electrically connected to the first terminal group through an anisotropic conductive film, for outputting a control signal to the display panel, the second wiring board having position indicating marks for indicating a disposition position of the anisotropic conductive film.

According to a second aspect of the present invention, there is provided a manufacturing method of a flat panel display device comprising: a display panel in which a plurality of display picture elements are disposed; a flexible electrode substrate having a plurality of leads to be connected electrically to the display panel; and a wiring board having a plurality of lands corresponding to the leads of the flexible electrode substrates and for supplying a control signal to the display panel, the manufacturing method comprising the steps of: disposing the leads of the flexible electrode substrate and the lands of the wiring board such that they oppose; irradiating with light having a light axis inclined at an angle smaller than 90° relative to an axis line of the lead; and detecting relative positions of the leads and the lands irradiated by the light and matching positions thereof by a picture detecting portion disposed above the leads.

According to a third aspect of the present invention, there is provided a flat panel display device wherein a connecting region at an end of a lead of a flexible substrate mounted on a display panel is connected to lands on a top surface of a wiring board via an anisotropic conductive film, the lands of the wiring board being longer than the connecting region of the lead of the flexible substrate.

According to a fourth aspect of the present invention, there is provided a flat panel display device wherein a connecting region at an end of a lead of a flexible substrate mounted on a display panel is connected to lands on a top surface of a wiring board via an anisotropic conductive film, the lands of the wiring board being longer than a width of the anisotropic conductive film.

According to a fifth aspect of the present invention, there is provided a manufacturing method of a flat panel display device comprising: a display panel; a flexible electrode substrate having a plurality of leads to be electrically connected to the display panel; and a wiring board having a plurality of lands corresponding to the lead of the flexible substrate and for supplying a control signal to the display panel, the manufacturing method comprising the steps of: disposing the anisotropic conductive film on the wiring board following position indicating marks provided on the wiring board to indicate a wiring position of the anisotropic conductive film;

disposing the leads of the flexible substrate and the lands of the wiring board such that they oppose; irradiating with light having a light axis inclined at an angle smaller than 90° relative to an axis line of the lead; detecting relative positions of the leads and the lands irradiated by the light and matching positions thereof by a picture detecting portion disposed above the leads; and fixing the flexible substrate and the wiring board with the anisotropic conductive film.

In the flat panel display device according to the first aspect of the invention, the position accuracy for providing the anisotropic conductive film can be improved and the working load can be reduced.

According to the manufacturing method of the flat panel display device of the second aspect of the invention, by irradiating light from a light source located substantially above an axis line of the lead of a flexible substrate, the shadow of the lead located below a thin film member appears on a top surface so that the position of the lead becomes clear. Then, the position of the lead whose position is made clear is matched with that of the land of the PCB and both the members are fixed with the anisotropic conductive film. In this case, because the light source is located substantially just above the axis of the lead, even if any shadow is generated by light from the light source, the size of the shadow is substantially the same as the width of the lead, therefore, an accurate positioning can be achieved.

In the flat panel display device according to the third aspect of the invention, if the flexible substrate has light transmitting characteristic, the shadow of the lead appears more clearly so that the positioning thereof is facilitated.

In the flat panel display device of the fourth aspect of the invention, by extending the lands of the PCB relative to the connecting region of the lead of the flexible substrate, the lands protrude from the lead portion when the position matching is carried out, so that the position of the land is made clear thereby facilitating the position matching thereof.

In the flat panel display device of the fifth aspect, because the lands of the PCB protrudes long from the ACF, even if the flexible substrate is superimposed on the ACF, the position matching thereof can be carried out easily because the lands protrudes further.

DESCRIPTION OF THE PREFERRED EMBODIMENTS

Hereinafter, a manufacturing method of a liquid crystal display module in a liquid crystal display device according to the present invention will be described.

In this liquid crystal display module, a side of each of a plurality of TCPs 12 is fixed to an edge portion of a liquid crystal cell 10 by ACF and the other side of each of the plurality of the TCPs 12 is connected to the PCB 14. As a first production process, a process for bonding the ACF 34 to a top of the PCB 14 will be described and as a second production process, a process for bonding the TCP 12 to the PCB 14 on which the ACF 34 is bonded will be described.

[First Production Process]

Figure 1:
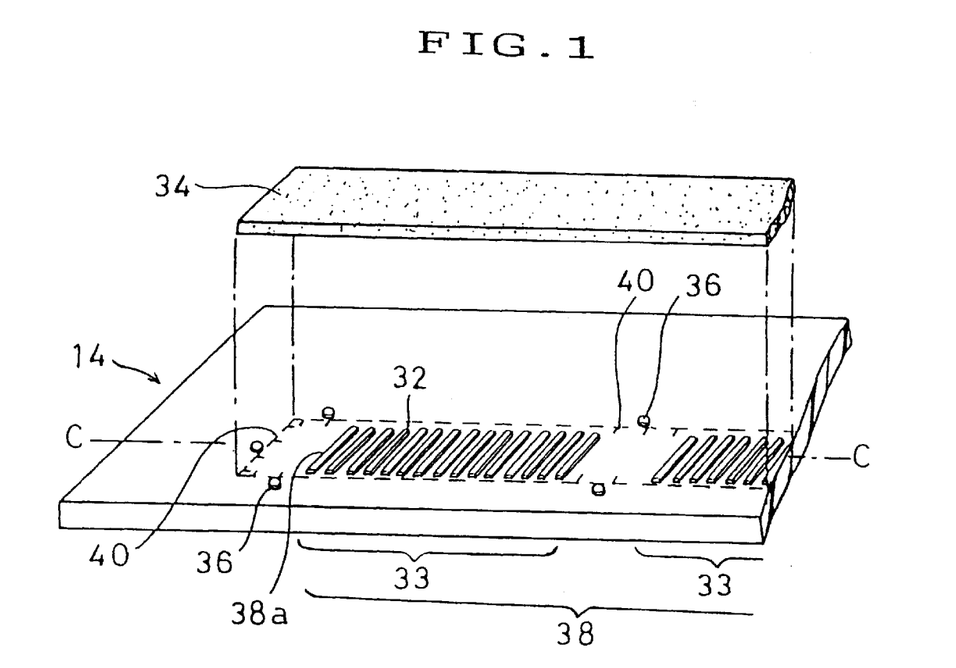
FIG. 1 is a schematic perspective view showing a condition in which the ACF is bonded to a top surface of a PCB in the first process.

The first production process will be described with reference to FIGS. 1–3. FIG. 1 is a schematic perspective view for explaining a procedure for bonding an ACF 34 to a top surface of a PCB 14 for driving in a liquid crystal display.

On a top surface of a substantially narrow rectangle shaped PCB 14 are formed a plurality (for example, 3–8) of land groups 33 to be connected to a plurality of leads 30 of the TCP 12. The land group 33 is formed by arranging 15–30 narrow rectangles at a predetermined interval in line and produced with a copper pattern. Position indicating marks 36 for bonding the ACF 34 are formed at positions surrounding each land group 33. The position indicating mark 36 is a copper thin film produced by a process for accumulating the same material as the land group 33 or patterning thereof. Thus, a sufficiently high position accuracy is assured for the position indicating mark 36 and land group 33.

In FIG. 1, the position indicating marks 36 are provided so as to surround a specified position 40 on which a single long tape like ACF 34 is to be bonded. Three position indicating marks 36 are provided corresponding to three sides of an end portion of the ACF 34 in the vicinity of an end 38a of row 38 of plural land groups 33, that is, the vicinity of a land 32 located at an extreme end of a row 38.

Further, two position indicating marks 36 are provided in a region surrounded by two land groups 33 corresponding to both sides of the ACF 34.

The position indicating marks 36 are provided symmetrically relative to a center line C—C connecting middle points of respective lands 32 and formed all of a circular pattern of the same dimension. Here, if an example of dimensional configuration is taken up, assuming that the length of each land (that is, width of the land group 33) is about 3.0 mm, the pitch of the land 32 (distance between corresponding two points of adjacent lands 32 in the land group 33) is about 0.3 mm and the length of each land 33 (dimension thereof in a terminal arrangement direction) is about 40 mm, the diameter of the position indicating mark 36 is 1.0 mm.

As described above, the position indicating marks 36 are disposed so as to surround an expected bonding place, restricting a up/down, right/left position. Therefore, it is possible to achieve improvement of the position accuracy and reduction of working time upon bonding the ACF 34.

Figure 2:
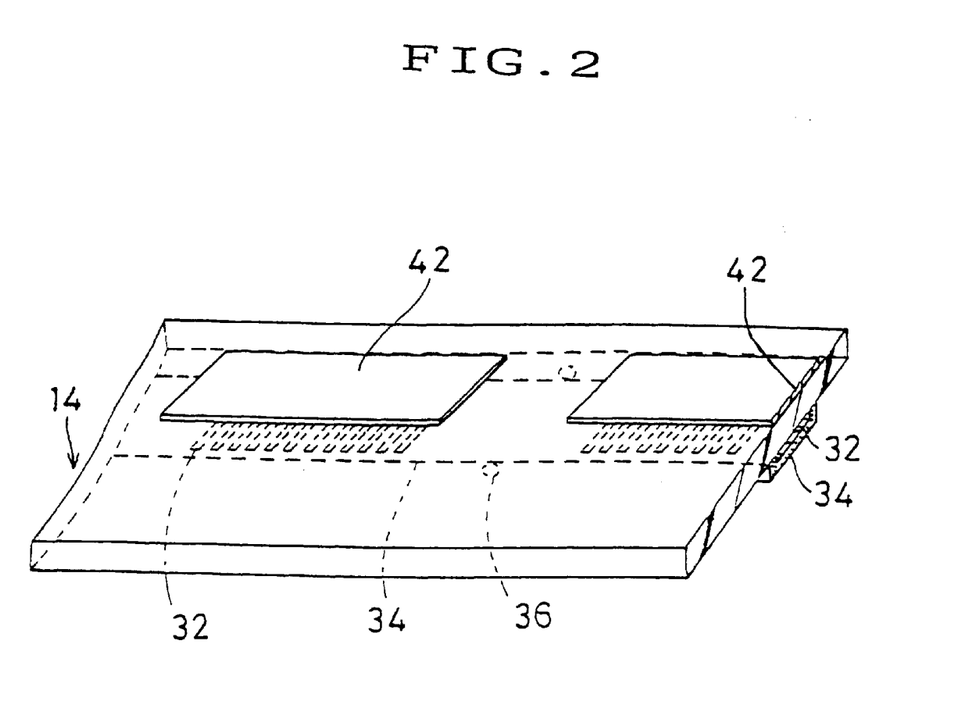
FIG. 2 is a schematic perspective view showing a back side of the PCB.

FIG. 2 shows a bottom surface of the PCB 14.

On a rear side of a region in which the land groups 33 are formed, only solid patterns 42, substantially rectangular, having an equal thickness are formed corresponding to this region. This solid pattern 42 is a thin copper film patterned in the same process as wiring in the neighborhood, however, this is an island pattern not connected to the wiring in the neighborhood.

Figure 3:
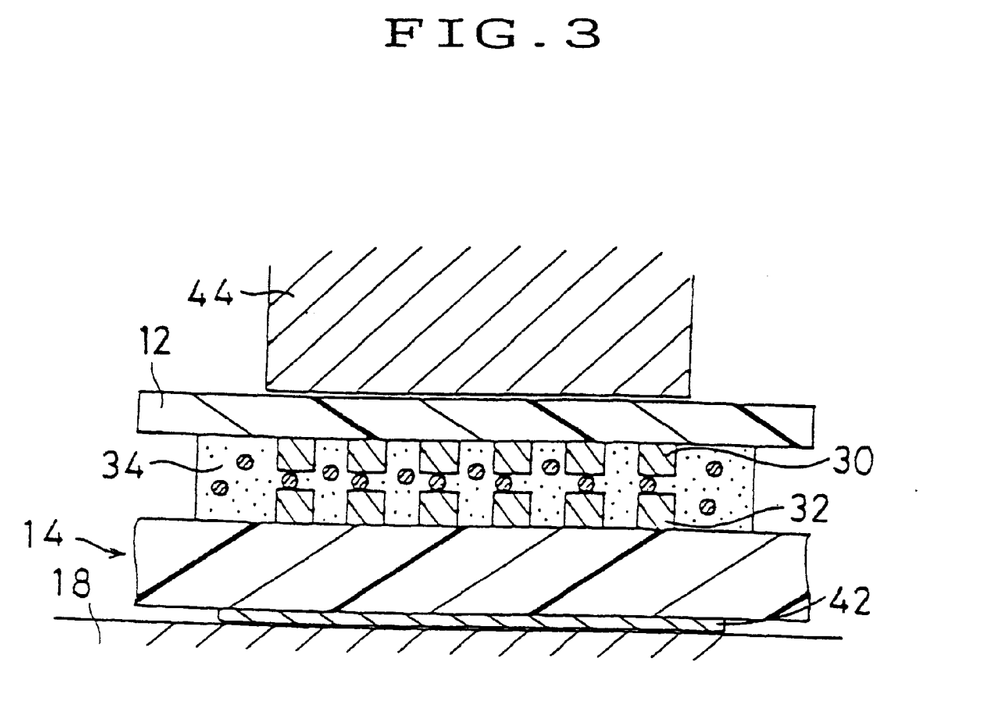
FIG. 3 is a schematic longitudinal sectional view of a thermo compression bonding process for the PCB.

FIG. 3 schematically shows a condition for thermo compression bonding of the PCB 14 having a bottom pattern shown in FIG. 2.

Because the solid patterns 42 having an equal thickness are formed on a bottom surface of the land groups 33 of the PCB 14, pressure unevenness in a terminal connecting region is prevented upon thermo compression bonding using a heat tool 44. Further, because the solid pattern 42 is made of metal , temperature unevenness is prevented. Therefore, reliability of thermo compression bonding can be improved largely. As a result, margins of pressure and heating time for securing the reliability sufficiently can be reduced largely, and therefore, a load of a process for thermo compression bonding and process time can be reduced.

Because the solid pattern 42 is provided independently of the adjacent metallic pattern, heat from the heat tool 44 is hardly dissipated to the surrounding through the metallic pattern. Therefore, provision of the metallic solid pattern 42 never reduce heating efficiency in thermo compression bonding.

Figure 4:
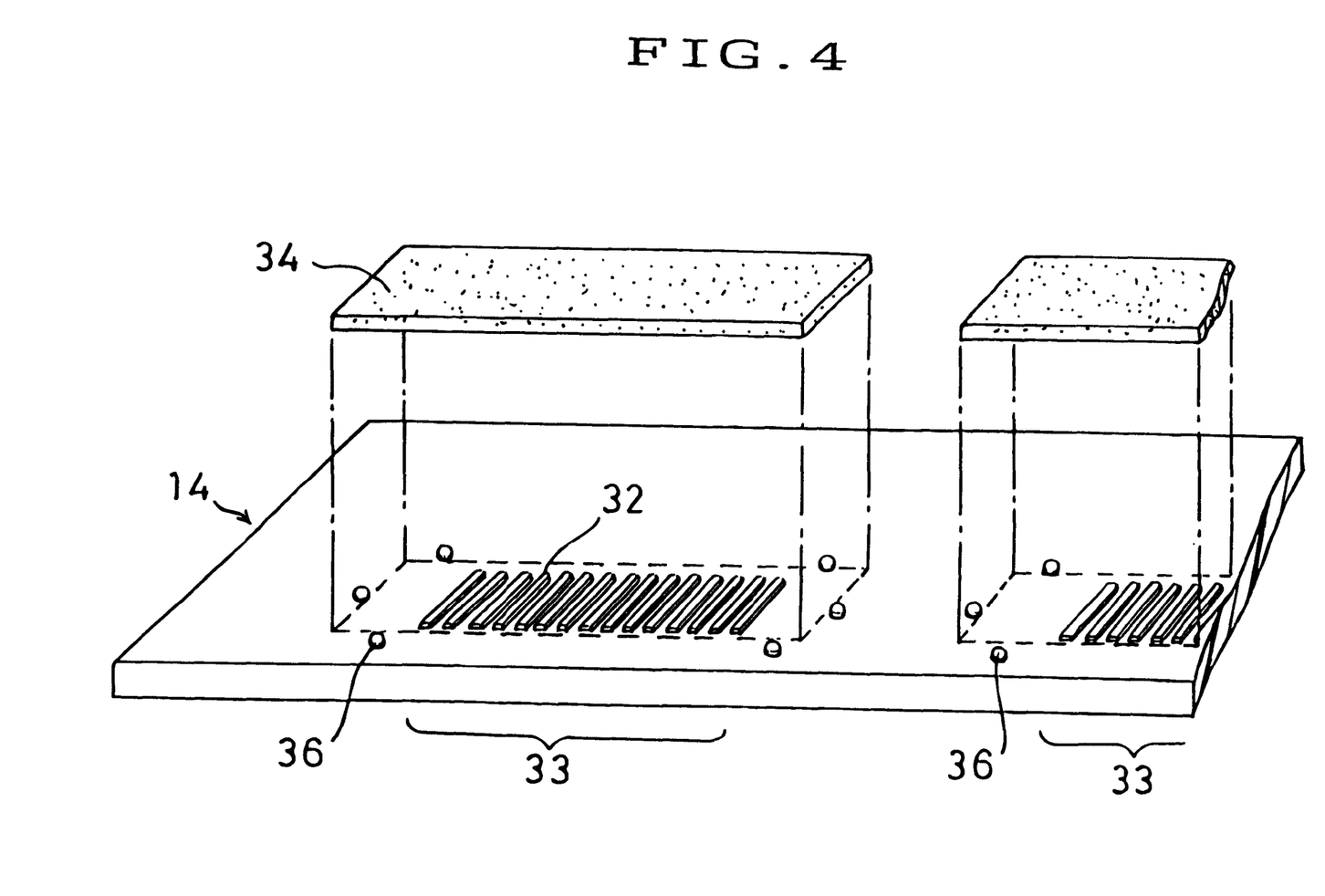
FIG. 4 is a schematic perspective view showing the bonding of the ACF to the top surface of the PCB according to a modification of the first manufacturing process.

FIG. 4 is a schematic perspective view of a modification of bonding the ACF 34 to a top of the PCB 14.

The position indicating marks 36 are formed for each land group 33 on this PCB 14 so as to be suitable for bonding of the ACF 34.

On both ends of each land group 33, three position indicating marks 36 are provided corresponding to a specified position 40 for bonding the ACF 34. These three marks are completely the same as the three position indicating marks 36 in the aforementioned embodiment (FIG. 1).

Although, according to the above embodiment, the solid pattern 42 is provided on the back because the PCB 14 is of a single layer, if the PCB 14 has a plurality of layers, it is permissible to form one layer of the inside layers as the solid pattern 42.

[Second Production Process]

A second production process will be described with reference to FIGS. 5–8.

Figure 5:
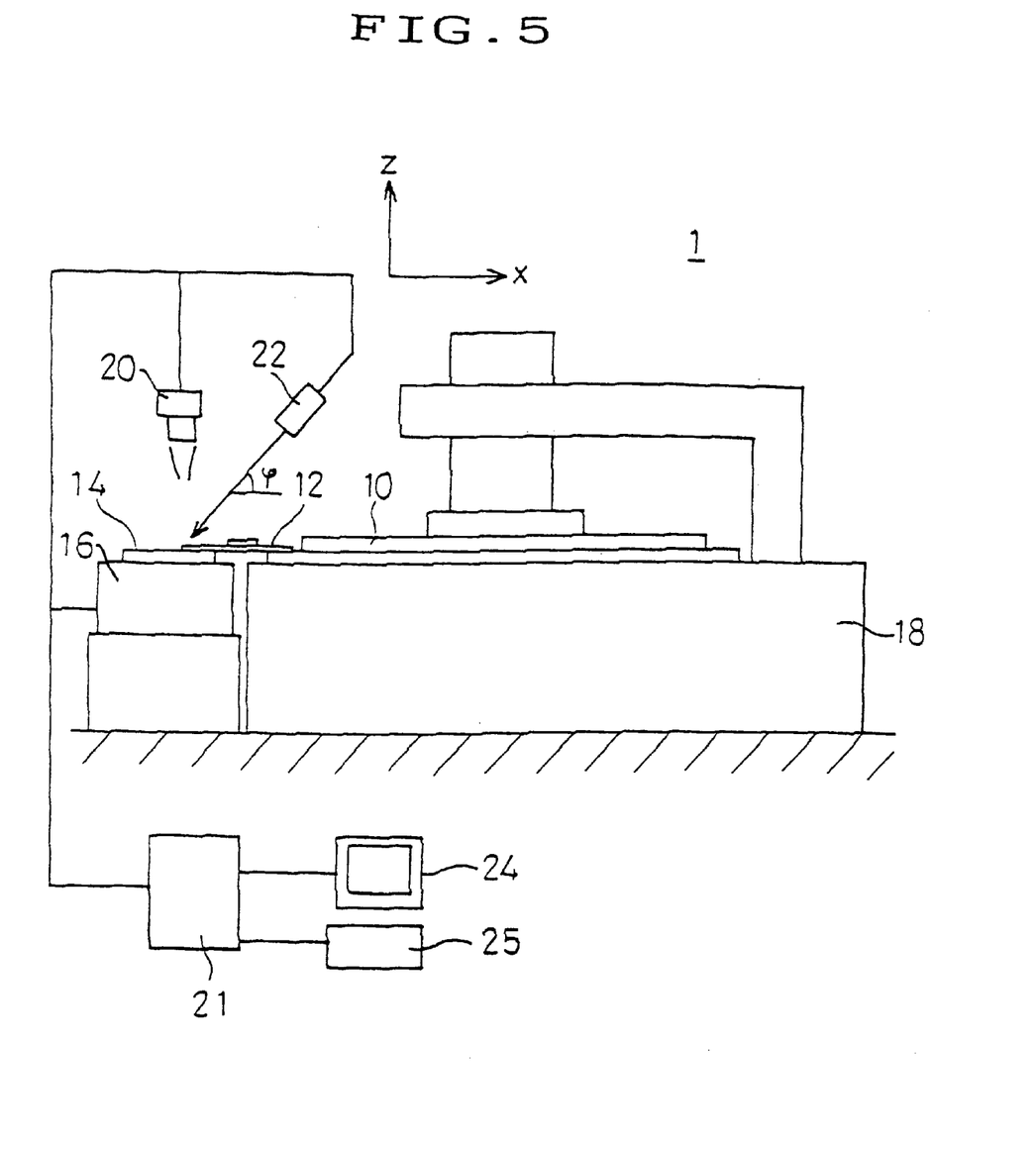
FIG. 5 is an explanatory view of a manufacturing process showing a second manufacturing process.

First of all, a positioning apparatus 1 for use in this process will be described with reference to FIG. 5.

A liquid crystal cell 10 is fixed to a fixing jig 16 in a condition that the TCP 12 is mounted. On the other hand, the PCB 14 is mounted on a traveling stage 18 provided along the fixing jig 16. This traveling stage 18 is movable relative to the fixing jig 16 so as to enable the positioning of the PCB 14 and TCP 12. To make the directions of the positioning apparatus 1 clear, it is assumed that the horizontal direction from the traveling stage 18 to the fixing jig 16 as shown in FIG. 5 is x-axis direction, a horizontally traveling direction of the traveling stage 18 (direction perpendicular to paper surface of FIG. 5) is y-axis direction and the height direction of the positioning apparatus 1 is z-axis direction.

A camera 20 having CCD is provided just above the PCB 14. On the other hand, a lighting device 22 for irradiating visible light is provided above the fixing jig 16, namely, above the liquid crystal cell 10. This lighting device 22 is mounted at a position for irradiating the PCB 14 and such that an angle formed between the x-axis direction and z-axis direction is $\phi$ as shown in FIG. 5.

A picture taken by the camera 20 is enlarged and displayed on a monitor 24. An operator operates a control unit 25 while watching this monitor 24 so as to move the traveling stage 18 in the direction of the y-axis, thereby the positions of the TCP 12 and PCB 14 being matched with each other. Reference numeral 21 designates a control section for controlling the traveling stage 18, camera 20, lighting device 22, monitor 24 and control unit 25.

Next, structures of the TCP 12 and PCB 14 will be described with reference to FIG. 6.

The TCP 12 is fixed to an edge portion of the liquid crystal cell 10 via the ACF as described before. On the TCP 12, an IC 28 is disposed in the center of a film 26 which is a rectangular, light transmission type polyimide film and leads 30 are provided on a back side of the film 26 from this IC 28 toward the other side thereof. An interval b of these leads 30 is 0.3 mm–0.4 mm.

On the other hand, the PCB 14 contains a circuit for driving the liquid crystal display unit and at a portion to be connected to the TCP 12 are provided the lands 32 at the same interval as the interval b of the leads 30.

Then, the ACF 34 is bonded on a top surface of the plural lands 32. The width c of this ACF 34 is shorter than the length d of the land 32 such that the land 32 is protruded by a length a. This protruding length a is 1 mm.

Next, the position of the leads 30 along its axis, of the TCP 12 and the light irradiation direction of the lighting device 22 will be described.

Figure 6:
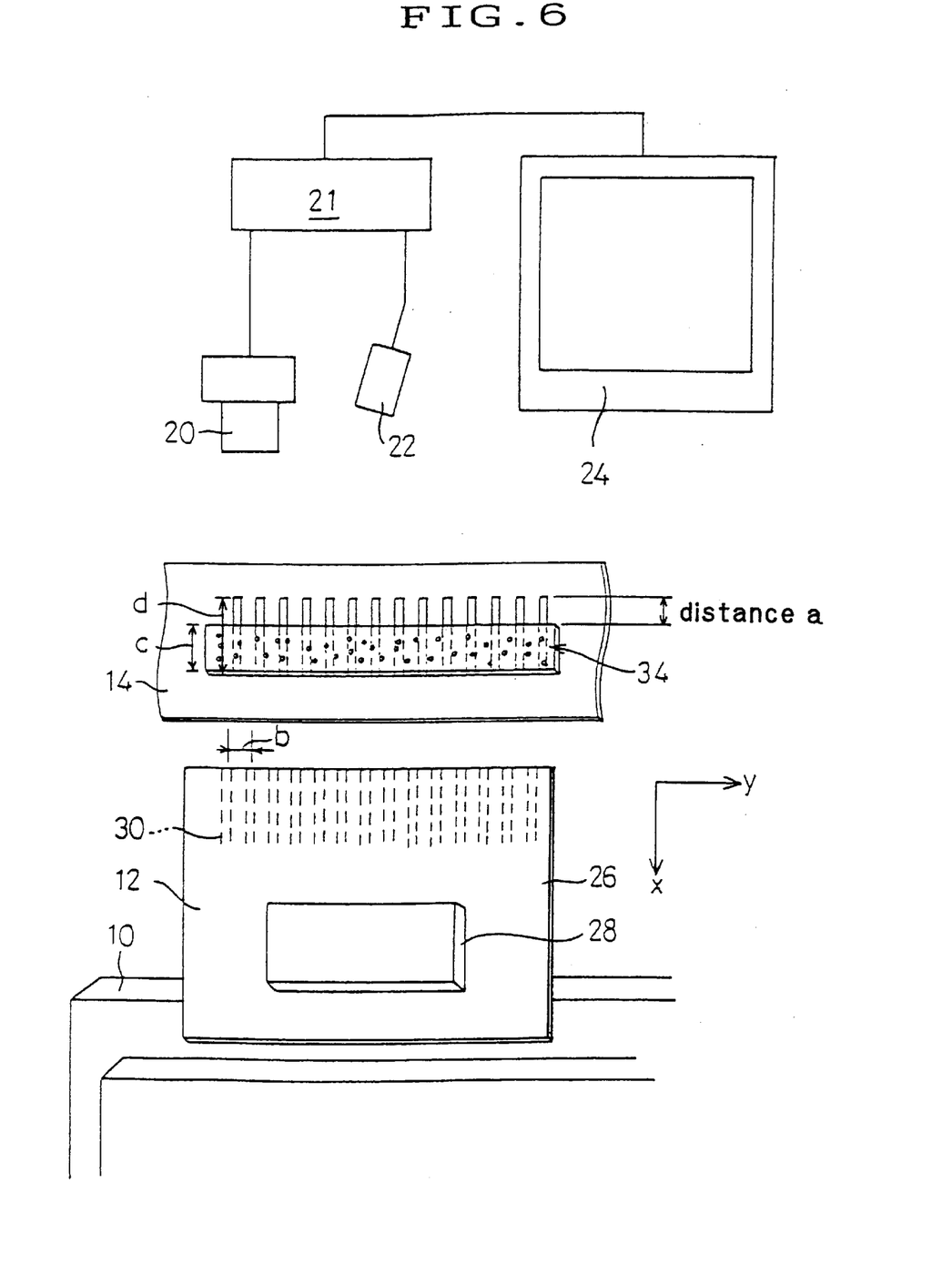
FIG. 6 is a plan view of a condition prior to attaching of the TCP to the PCB.

As shown in FIG. 6, the irradiation direction of light is inclined at an angle $\theta$ relative to the axis line of the lead 30. The range of this angle $\theta$ is from 0° to 40° and specifically, 0° to 30° is preferable. This angle $\theta$ is different from the angle $\phi$ formed between the x-axis and z-axis of FIG. 5, but an angle formed between the x-axis and y-axis.

Connecting of the TCP 12 and PCB 14 having the above described structure will be described.

1. First Process

As shown in FIG. 6, the ACF 34 is bonded to the PCB 14. In this case, the land 32 protrudes from the ACF 34 by a distance a.

2. Second Process

Figure 7:
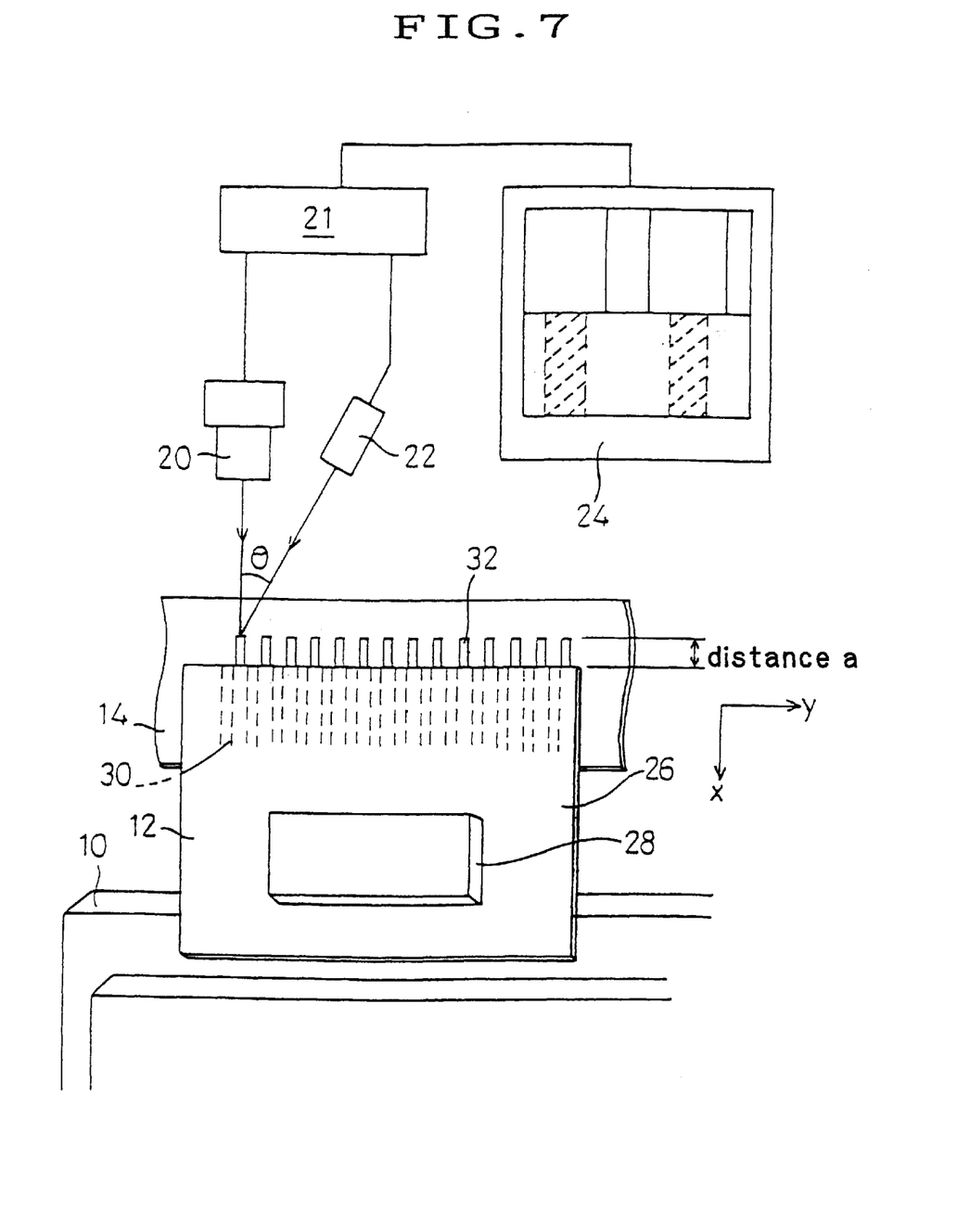
FIG. 7 is a plan view showing a condition in which the TCP is put on the PCB so as to match the positions of the TCP and PCB.

As shown in FIG. 7, the traveling stage 18 is carried near the fixing jig 16 so that the TCP 12 covers the ACF 34 of the PCB 14.

3. Third Process

Figure 8:
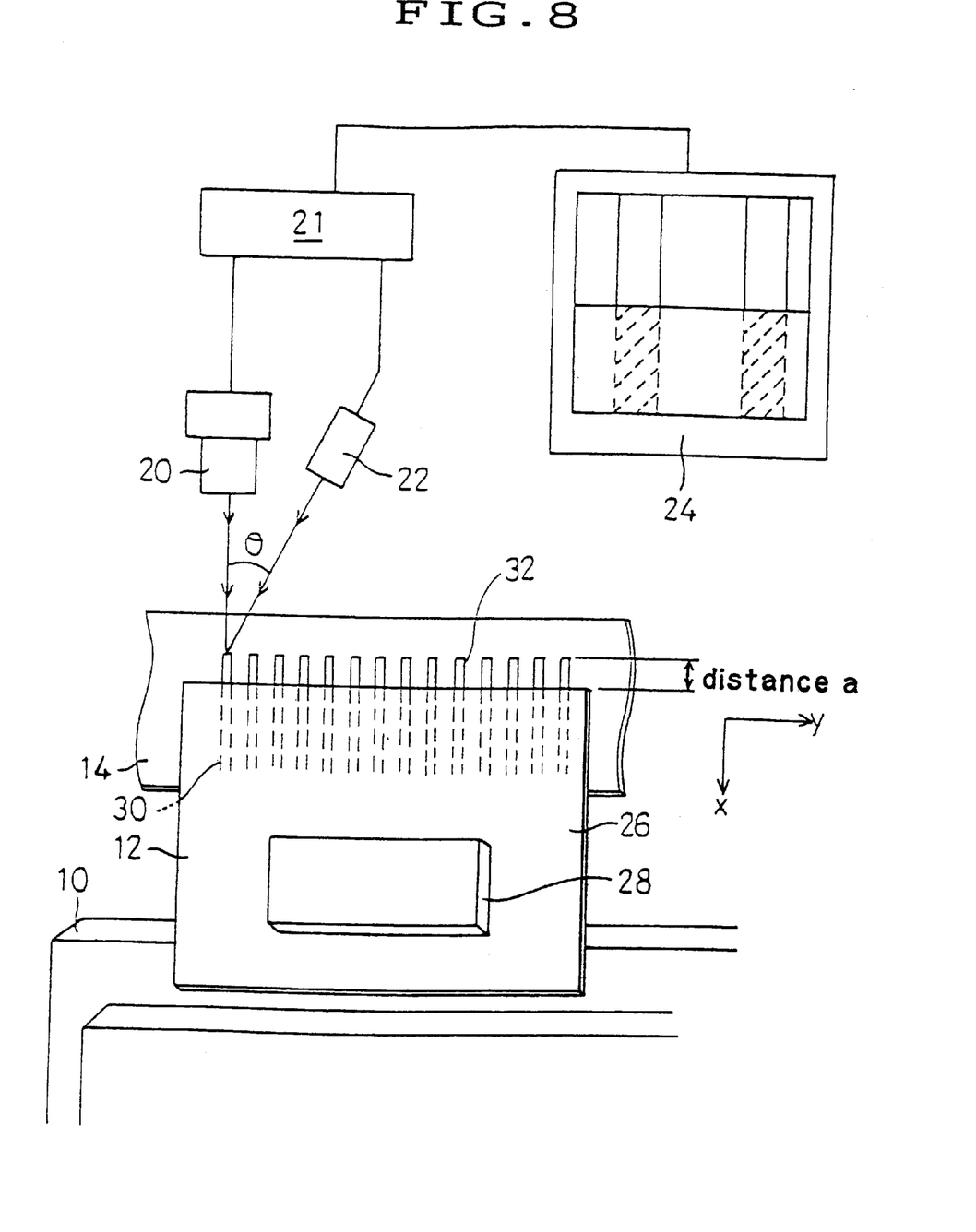
FIG. 8 is a plan view showing a condition that the positions of the TCP and PCB are matched with each other.

As shown in FIG. 8, the traveling stage 18 is moved along the y-axis so as to match the positions of the leads 30 with those of the lands 32. How to match the positions thereof in this case will be described in detail.

3-1 Process

First of all, the lead 30 located at the leftmost of the TCP 12 is matched with the land 32. In this case, because light is irradiated by the lighting device 22, the leads 30 on the back of the film 26 become seen as a shadow as a figure shown in the monitor 24 of FIG. 7. Thus, an operator matches the lead 30 with the land 32 by watching this monitor 24. Further, because the land 32 protrudes from the ACF 34, the position can be distinguished clearly. In this manner, the lead 30 on the left side is matched with the land 32.

3-2 Process

Next, the lead 30 located at the rightmost is matched with the land 32, so that finally the lead 30 is matched with the land 32 in the center line of the TCP 12.

4. Fourth Process

The TCP 12 and PCB 14 are bonded together by applying a pressure from the top face of the film 26.

By the above described process, the position matching between the lead 30 and land 32 having a finer pitch of 0.4–0.3 mm than the conventional art can be achieved.

Further, because the lighting device 22 is located within the angle θ relative to the axial direction of the lead 30, even if a shadow is generated as a result of irradiation, the width of that shadow is smaller than that of the lead 30 is small. Thus, the position matching is facilitated.

Further, because the land 32 protrudes from the ACF 34, even if the ACF 34 is covered with the TCP 12, the position of the land 32 can be distinguished clearly.

Further, if the connecting region of the lead 30 is made shorter than the land 32, the position matching can be carried out more easily.

Although according to the above described embodiment, the lighting device 22 is provided above a liquid crystal cell 102, it is permissible to provide it below the TCP 12 so that light is irradiated from below the TCP 12 so as to pick up the shadow of the leads 30.

Further, the light irradiated by the lighting device 22 is not restricted to visible light if it can be distinguished by the CCD, but may be other light such as ultraviolet ray, infrared ray and the like.

Figure 9:
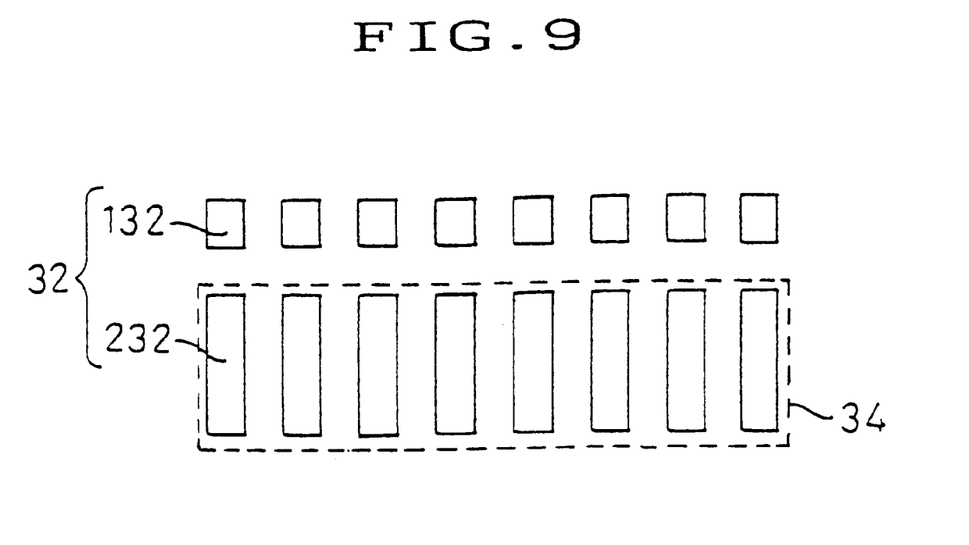
FIG. 9 is a plan view showing a modification of the lands in the second manufacturing process.

FIG. 9 shows a modification of a structure of the land 32 of the PCB. A point thereof different from the above described embodiment is that, according to this modification, when the land 32 is protruded from the ACF 34, the land 32 is not protruded continuously, but a land 232 and a land positioning portion 132 are formed by in continuous patterning. In this case also, because the land 32 protrudes from the ACF 34, even if the ACF 34 is covered with the TCP 12, the position of the land 32 can be distinguished clearly.

Although in the above embodiment, connecting of the PCB and TCP is exemplified for description, it is permissible to use a flexible wiring board or the like as a flat panel display device instead of the TCP. As the flat panel display device, it can be applied to plasma display, EL and the like as well as a liquid crystal display.

Industrial Availability

According to the present invention, for the PCB in a flat panel display device provided with terminal groups connected to other wiring board through an anisotropic conductive film, the accuracy of positioning for provision of the anisotropic conductive film can be improved and a load of work can be reduced. Further, in thermo compression bonding for bonding the anisotropic conductive film by pressure by heat, a pressure unevenness and a temperature unevenness can be reduced, so that the reliability of the connection can be improved remarkably.

Further, according to the present invention, the position matching between the lead as a connection part and the land of the PCB can be carried out easily and the position matching of the lead having a finer pitch than the conventional art can be carried out.

What is claimed is:

1. A flat panel display device comprising;

a display panel, a flexible substrate having leads and a connecting region at an end of each leads, and connected to said display panel, a wiring board having lands corresponding to said leads, said lands disposed on a top surface thereof, and an anisotropic conductive film disposed between said leads and lands so as to electrically connect them;

wherein said lands are longer than the connecting region of the leads.

2. A flat panel display device comprising;

a display panel, a flexible substrate having leads and a connecting region at an end of each leads, and connected to said display panel, a wiring board having lands corresponding to said leads, said lands disposed on a top surface thereof, and an anisotropic conductive film disposed between said leads and lands so as to electrically connect them;

wherein said lands are longer than a width of said anisotropic conductive film.

* * * * *